United States Patent
Annerino et al.

(12)

(10) Patent No.: US 6,413,117 B1
(45) Date of Patent: Jul. 2, 2002

(54) AXISYMMETRIC VIBRATOR, VIBRATOR CONNECTION, AND MOUNTING SYSTEM

(75) Inventors: Frank Annerino, Rolling Meadows; Sajid Patel, Des Plaines, both of IL (US)

(73) Assignee: Palm, Inc., Santa Clara, CA (US)

( * ) Notice: Subject to any disclaimer, the term of this patent is extended or adjusted under 35 U.S.C. 154(b) by 0 days.

(21) Appl. No.: 09/797,169

(22) Filed: Feb. 28, 2001

(51) Int. Cl.⁷ .............................................. H01R 3/00
(52) U.S. Cl. ...................................................... 439/500
(58) Field of Search ..................... 439/500, 68; 310/81, 310/40 MN (56) References Cited

U.S. PATENT DOCUMENTS 5,395,263 A * 3/1995 Sandell ....................... 439/500
5,749,737 A   5/1998 Zuin
5,986,367 A * 11/1999 Tsuzaski et al. .............. 310/81

\* cited by examiner

*Primary Examiner*—Neil Abrams
*Assistant Examiner*—Phuong K T Dinh
(74) *Attorney, Agent, or Firm*—Crosby, Heafey, Roach & May (57) ABSTRACT

A vibrator motor mount for an axisymmetric vibrator is mounted directly on a PCB or other mounting surface and includes a clip for holding the vibrator and a spring type connector. The clip and the vibrator make contact and establish a first electrical connection. The spring type connector makes contact with an end of the vibrator establishing a second electrical connection. The spring type connector and clip are electrically isolated and provide positive and negative electrical contacts for operation of the vibrator. Portions of the vibrator held by the clip and an end of the vibrator that contacts the spring type connector are also electrically isolated and are attached to the internal electronics of the vibrator.

18 Claims, 6 Drawing Sheets

Prior Art

AXISYMMETRIC VIBRATOR, VIBRATOR CONNECTION, AND MOUNTING SYSTEM

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of Invention

Preferably the clip is a cylindrical shape that matches a cylindrical body of the vibrator. The motor includes a contact pad type connector at the end of the motor where the spring type connector contacts the motor.

The present invention relates to mounted electrical devices, and, more particularly to the mounting of an electronic vibrator on a PCB board or other surface.

2. Discussion of Background

Various mounting devices such as brackets or other appliances are used to mount electrical or electronic devices on the surface of a printed circuit board. Some of the mounting devices not only perform the mechanical function of mounting the device to the board, but electrical connections are provided for interconnecting the device to appropriate circuit traces on the board.

One such mounting means is a motor-mount bracket for mounting a small motor on a printed circuit board and interconnecting leads or terminals of the motor to appropriate circuit traces on the board. For example, Zuin, U.S. Pat. No. 5,749,737 provides a bracket for mounting a motor device on a PCB board that includes electrical connections. Typically, motor-mount brackets include a dielectric housing such as of molded plastic or the like. The housing includes a receptacle for mounting the motor, and contacts are provided on the housing for interconnecting the motor terminals to the circuit traces on the board.

Motor-mount brackets of the character described above are used in a wide variety of applications. In some applications, the assembly may be subjected to considerable physical abuse. One such application is in a pager wherein a vibrator motor typically is mounted on a printed circuit board. The pager must withstand considerable physical abuse such as drop tests or other specified parameters. Consequently, the dielectric housing must be quite robust to maintain the motor in its receptacle. This causes problems not only in the dielectric housing taking up too much "real estate"on the printed circuit board, but the base of the housing must be relatively thick and, thereby, presents a relatively high profile for the overall bracket structure. Solving these and other problems in mounting the electrical devices has made the manufacturing process of devices with mounted electrical devices more complex than might otherwise be necessary.

Figure 1:
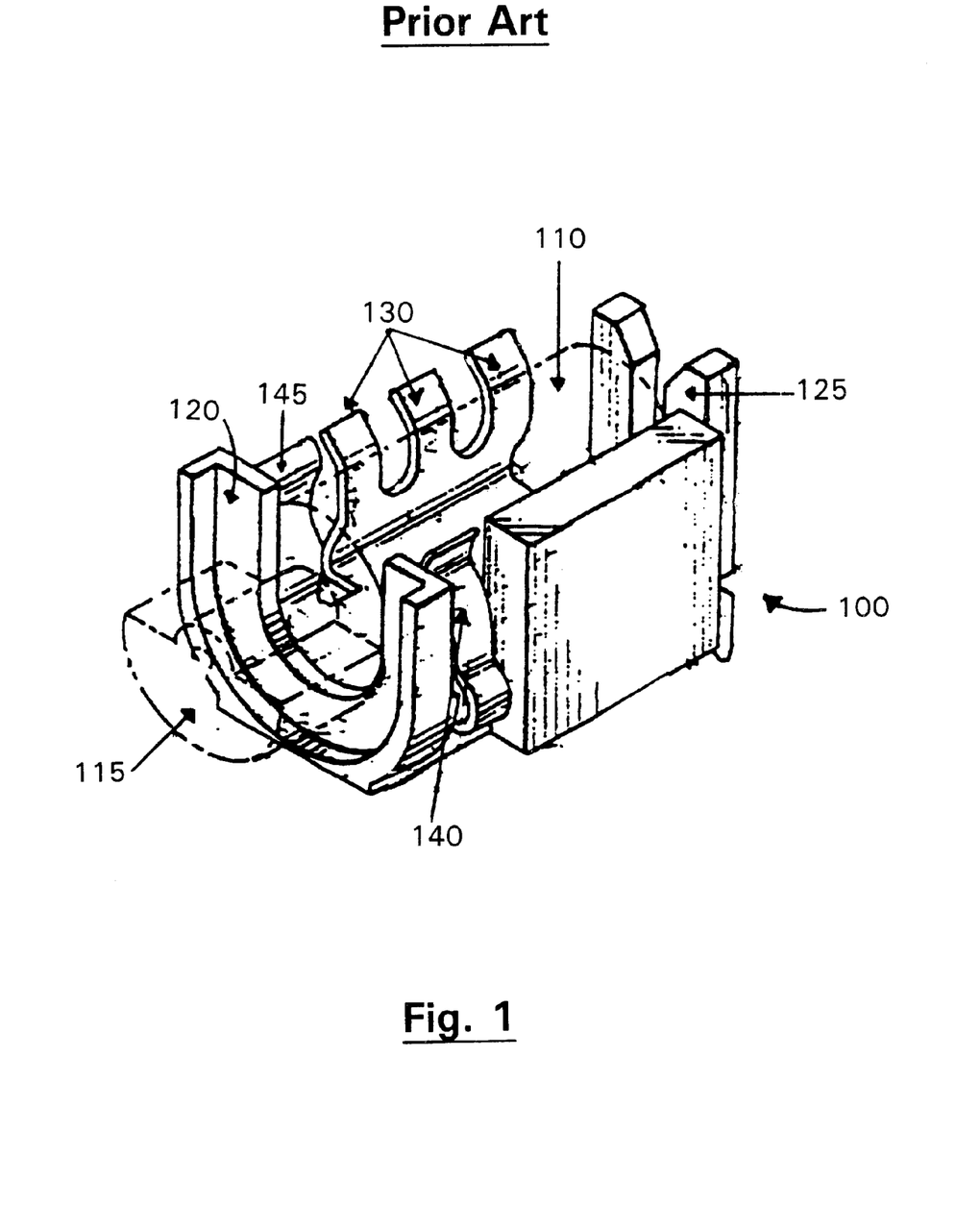
FIG. 1 is a prior art motor mounting bracket.

For example, in Zuin, a motor mount bracket 100 is constructed of a dielectric housing for holding a motor 110. Zuin's motor mount bracket includes a front wall 120 and rear wall 125, spring fingers 46 for embracing the motor 110. Electrical contacts 140 and 145 engage terminals on opposite sides of the motor 110. Therefore, it can be seen that during the manufacturing process, a motor being mounted to the mounting bracket 100 must be oriented such that the electrical contacts are aligned with and engage the terminals on opposite sides of the motor.

Therefore, there exists a need for improvements in the design of motor mounts. These improvements are needed to make the mount itself better and to better facilitate the manufacturing process.

SUMMARY OF THE INVENTION

The present inventors have realized that electronic devices that are easily mounted into mounting brackets, and maintain a low profile gain the advantages of a smaller total area of a finished product and are of lower cost to produce. In addition, the manufacturing process is improved if the mounting bracket does not require specific orientation of the motor to the brackets. The present invention provides a low profile mounting bracket that requires no special orientation of the electronic device being mounted. Preferably, the invention is practiced in the mounting of a motor type vibrator or axisymmetic vibrator to an electronic printed circuit board (PCB).

The motor mount includes a clip for holding the vibrator and a spring contact. The clip and the vibrator make contact and establish a first electrical connection. The spring contact makes contact with a bullseye contact pad on an end of the vibrator establishing a second electrical connection. The spring contact and clip are electrically isolated and provide positive and negative electrical contacts for operation of the vibrator. Portions of the vibrator held by the clip and contacted by the spring contact of the motor mount are also electrically isolated and are attached to the internal electronics of the vibrator. Preferably the clip is a cylindrical shape that matches a cylindrical body of the vibrator.

The present invention is embodied as a motor mount, comprising, a low profile base, a clip holder connected to said base, a contact having an electrical connection not electrically connected to said base, wherein said clip holder is configured to hold a motor and make a first electrical connection with the motor, and said contact is configured to make a second electrical connection with said motor.

The present invention includes an electric motor, comprising, a housing constructed of an electrically conductive material and connected to a first electrical contact of said motor, and a bullseye contact pad type connector constructed of an electrically conductive type material and electrically isolated from said housing, wherein said housing and said bullseye contact pad type connector are configured as first and second exterior terminals for providing electricity for operation of the electric motor.

The present invention includes a method of mounting a motor to an electrical device, comprising the steps of, mounting a low profile motor mount having a clip style motor attachment and electrical contacts that do not require motor and electrical contact alignment to a portion of the electrical device, electrically connecting the electrical contacts to a power line and ground of the electrical device; and snapping an electrical motor into the clip style motor attachment.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 2:
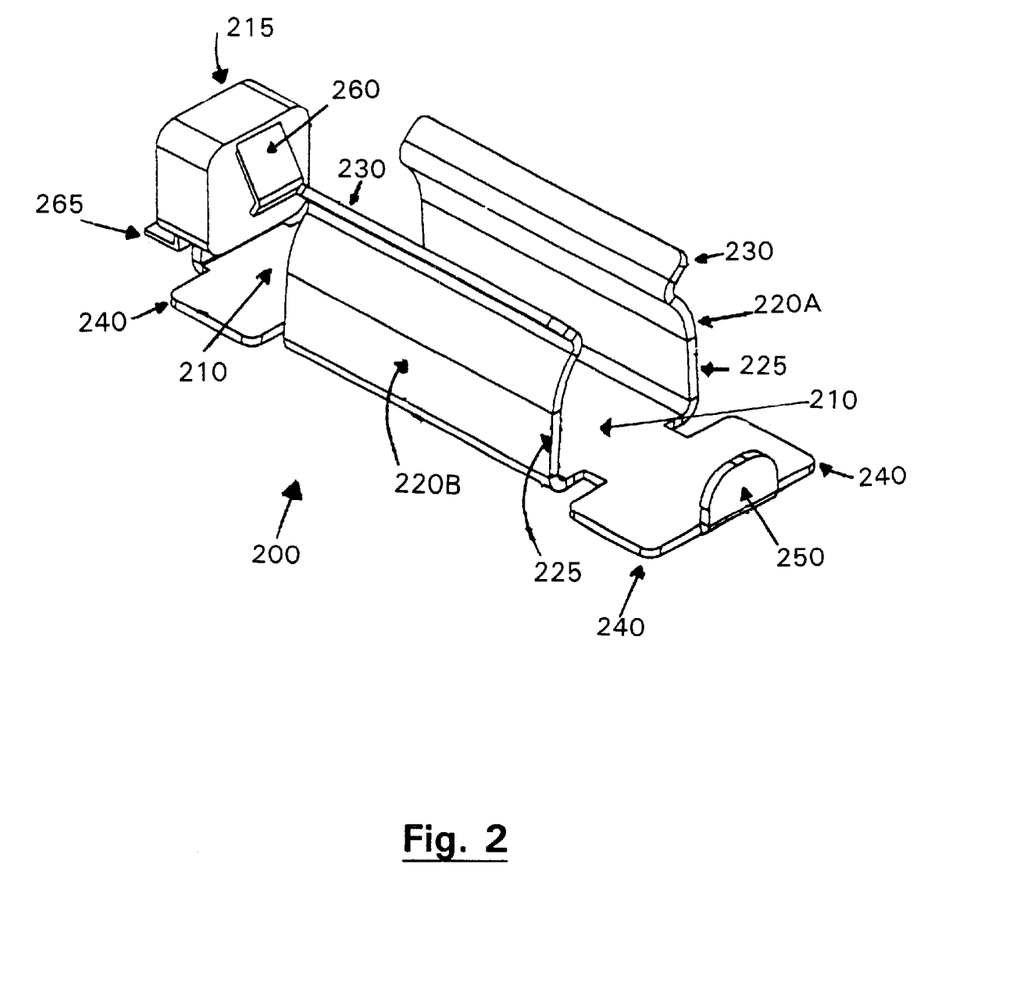
FIG. 2 is a drawing of a motor mounting bracket according to an embodiment of the present.

Referring again to the drawings, wherein like reference numerals designate identical or corresponding parts, and more particularly to FIG. 2 thereof, there is illustrated FIG. 2 is a drawing of a motor mount bracket 200 according to an embodiment of the present. The motor mount bracket 200 is a low profile bracket. The bracket 200 is constructed of thin conductive material, such as sheet metal. The bracket includes a base 210, right and left clips 220A and 220B, and an end connector 215. The base 210, being constructed of a thin material provides for a low-profile mounting platform for the motor.

Preferably, left and right clips 220A and 220B are each form fitted to at least a portion of the motor that is intended to be mounted by the bracket 200. For example, for an elongated cylindrical motor, the clips of bracket 200 would have a long and cylindrical form factor 225 as shown in FIG. 2. The form factor 225 facilitates holding of the motor once mounted into the bracket 200 and provides a large contact area between the bracket and motor. The left and right clips also have flange portions 230 running along a side of the clips that facilitate entry of the motor into the clips grasp. For assembly, the motor is snapped into the clips 220A and 220B.

Solder pads 240 are used to physically secure and electrically connect the mounting bracket to a PCB or other device to which the motor is to be attached. Solder pads 240 are electrically connected to the base 210 and clips 220A and 220B. The base and clips, using the large contact area, for an electrical connection between the solder pad(s) and the motor when mounted in the clips.

The end connector 215 is electrically isolated from the base 210. Preferably, the end connector 215 and base 210 are attached, but electrically isolated, in a single integrated piece forming the mounting bracket. For example, the end connector 215 may be constructed of a dialectric material attached to the base 210, and holding the spring contact 260, the solder foot 265, and an electrical connection betwwen the spring contact and solder foot.

However, separate pieces for the end connector 215 and base 210 may be utilized. The end connector may be constructed from a single bracket. The end connector 215 includes a contact 240, that is preferably a spring type contact, but may be any type of contact that allows free sliding of a motor into the bracket 200.

Solder pad 265 is used to physically secure and electrically connect the end connector 215 to the PCB or other device to which the motor is to be attached. Solder pad 265 is electrically connected to the end connector 215. The end connector, using contact 260, makes an electrical connection between the solder pad 265 and the motor when the motor is mounted in the clips 220A and 220B. The entire end bracket may be constructed as an S shaped bracket, a top portion of the S forms the spring contact 260, and the bottom portion forming a foot (solder pad 265) for soldering the bracket to the printed circuit board (PCB). Preferably, the solder pads 265 and 240 are soldered directly to traces or other contacts on the PCB.

An end wall 250 is placed at an opposite side to the end connector 215. The end wall 250 is used to retain the motor in an axial direction. Preferably, the end wall is a semi-circular attachment to the base 210 and has a radius less than a height of a lowest point (measured from a top surface of the base to a bottom surface of a main shaft of the motor. The end wall 250 is one piece and is preferably constructed from a same piece that forms the base 210.

For installation, the motor is snapped into the clips 220A and 220B by applying pressure to the motor as it is placed against flanges 230. Under pressure, the clips spread and the motor snaps into an area between the clips. The spring contact 260 pushes against an end of the motor, and an opposite end of the motor rests against the end wall 250.

Figure 4:
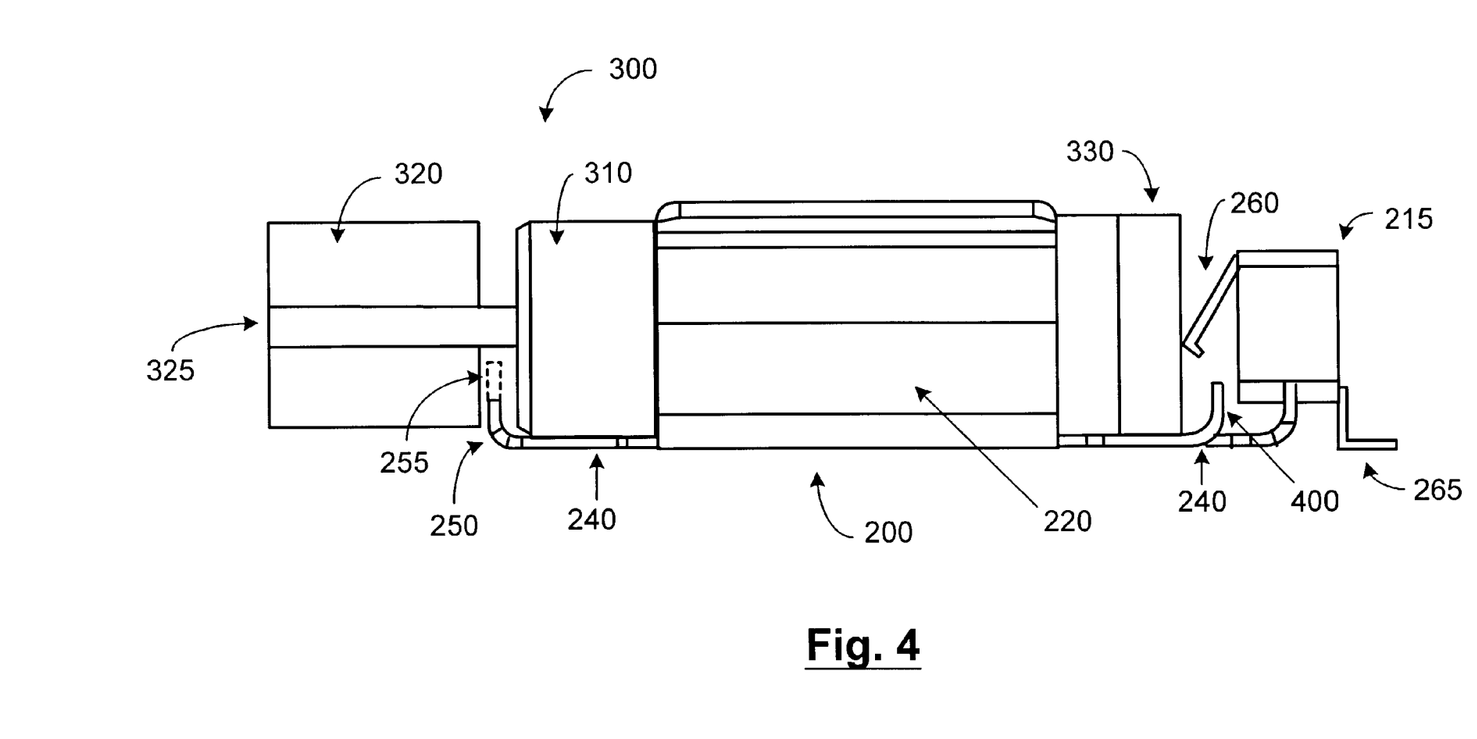
FIG. 4 is a drawing of a motor fitted to a mounting bracket according to an embodiment of the present invention.

In a preferred embodiment, the bracket 200 also includes a contact end tab 400. The contact end tab 400 is a stop that maintains a position of the motor and prevents the motor from crushing the end contact (end spring) 260 during an impact or other displacement event of the device in which the motor and bracket are installed (e.g., dropping a palm top computer having the motor and bracket installed). The contact end tab 400 may be embodied as an integral part of the mounting bracket, attached, for example, to any one of the mounting bracket base 210, clips 220, or as part of the end connector 215.

Figure 3A:
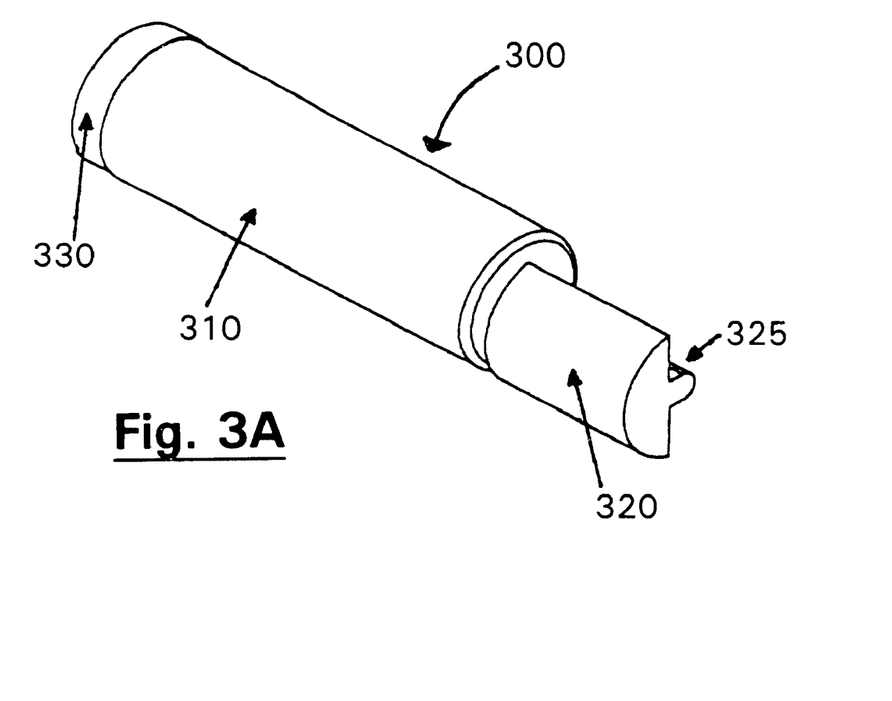
FIG. 3A is a first view of a motor according to an embodiment of the present invention.

FIG. 3A is a first view of a motor 300 according to an embodiment of the present invention. The motor is configured as an axisymmetric vibrator which is a motor having a weight 320 attached to a shaft 325 of the motor. The weight is off-center causing a vibration when the shaft is turning during motor operation.

The motor 300 has an external housing (or casing) 310 which contains the main functioning parts of the motor (coil windings, magnets, etc.). The motor may be a standard configuration electrical motor or a motor of other design types. The housing 310 is constructed of an electrically conductive material and is electrically connected to one electrical lead of the motor. Preferably, the electrical lead connected to the housing is the negative, or ground lead of the electric motor, making the housing 310 a negative terminal for providing electric current for running the electric motor. The motor 300 includes a dielectric or insulator layer 330.

Figure 3B:
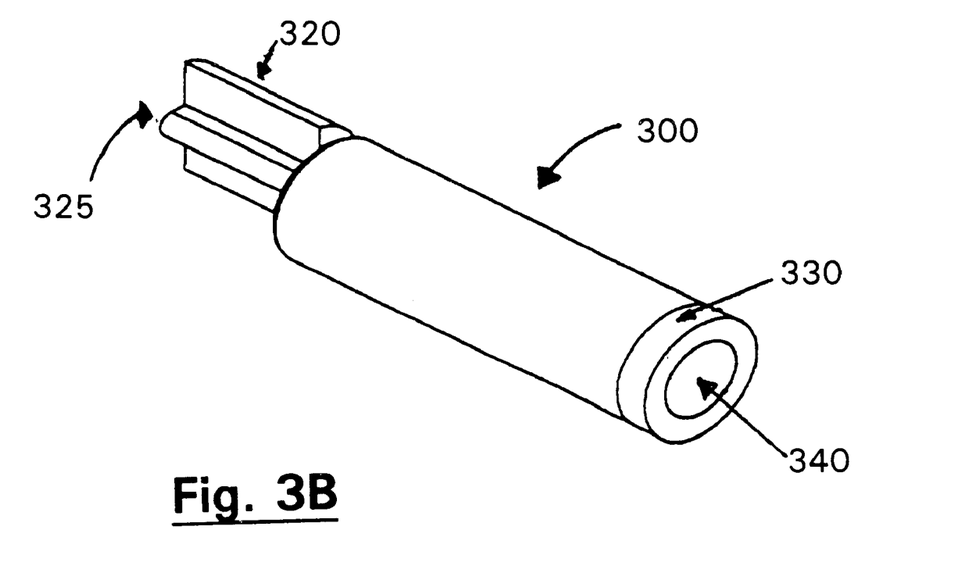
FIG. 3B is a reverse view of a motor according to an embodiment of the present invention.

FIG. 3B is a reverse view of a motor according to an embodiment of the present invention. As seen in the reverse view, insulator layer 330 electrically isolates a contact pad 340 from the housing 310. Preferably, the contact pad 340 is a bullseye contact pad. At least a center area of the contact pad 340 is an exposed pad of copper, or other electrically conductive material, for example. The contact pad 340 is electrically connected to an electrical lead of the motor. Preferably, the contact pad 340 is connected to the positive (or +) electrical lead of the motor, making the contact pad 340 a positive terminal for providing electrical current for operation of the motor. Then, in a typical installation of the motor mounting bracket 200, solder pads 240 are soldered to negative, or ground, traces of a PCB, and solder pad 265 is soldered to a positive trace of the PCB.

Since the contact pad is one terminal at an end position of the motor, and the housing is a second terminal, it can now readily be seen that the motor may be snapped into motor mount 200 without regard to a specific orientation, or alignment, of the motor, and, regardless of the installed alignment, make positive contact with each of the terminals (spring contact 260 making contact with the contact pad 340 positive terminal, and the bracket, with at least part of one of the base 210, end wall 250, and clips 220A and 220B making contact with the housing 310).

FIG. 4 is a drawing of a motor fitted to a mounting bracket according to an embodiment of the present invention. The motor 300 is clipped between clips 220A and 220B, and is contacted by spring contact 260 at a bullseye connector 340 (see FIG. 3). An end wall 250 is shown, and a dotted area 255 shows an example range of heights that the end wall may be constructed.

Figure 5A:
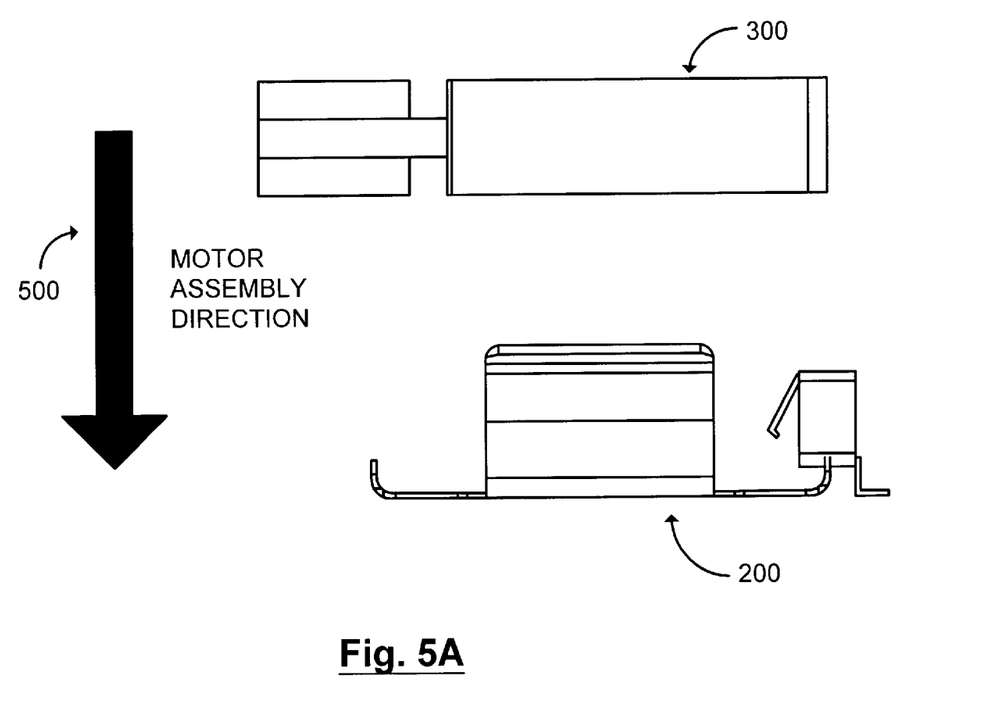
FIG. 5A is a drawing illustrating attachment of a motor and mounting bracket according to an embodiment of the present invention.
Figure 5B:
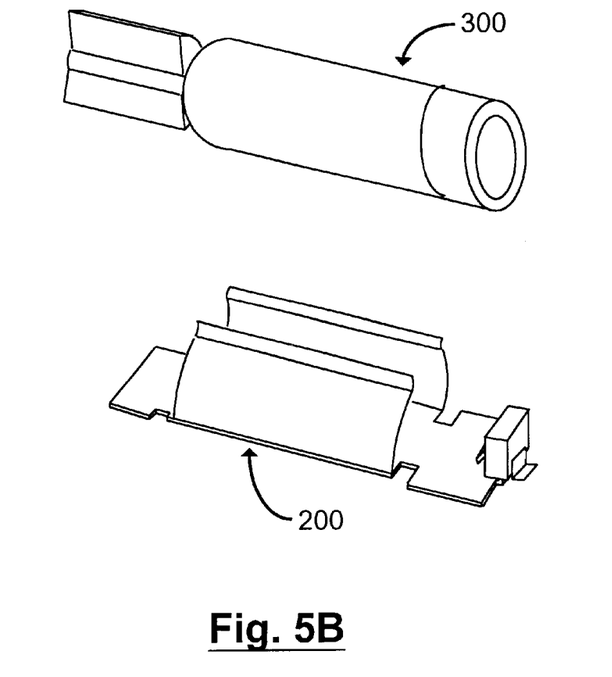
FIG. 5B is a 3-D drawing of a separate motor and motor mount according to an embodiment of the present invention.
Figure 5C:
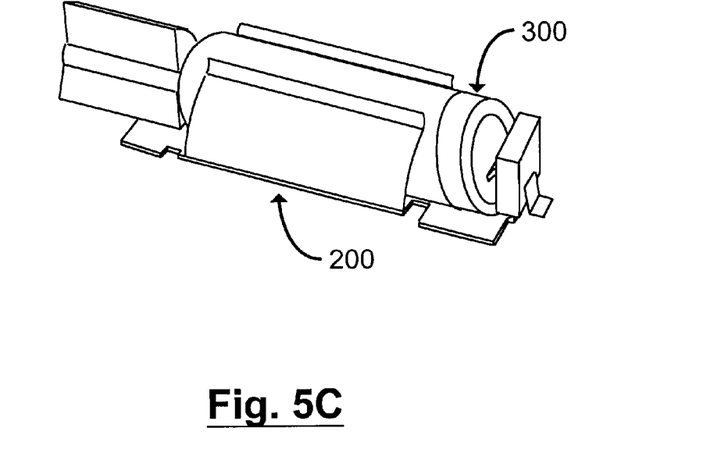
FIG. 5C is a 3-D drawing of a combined motor and motor mount according to an embodiment of the present invention.

FIGS. 5A–5C illustrate a process for installing a motor, or vibrator unit, into the motor mounting bracket 200. After the motor mounting bracket has been affixed to a PCB board, and the solder pads fixed to appropriate traces of the PCB board. In FIG. 5A, the motor assembly direction 500 shows a motion for snapping the motor into the motor mounting bracket 200 and the clips 220A and 220B.

In the motor assembly direction, the motor is snapped into the motor mounting bracket 200 by the installer, without the installer needing to orient the motor in the axial direction as would be needed if the motor had spring contacts or plug-in type connections. The negative contact is made between the metal (or electrically conductive) housing 310 and the motor mounting bracket 200, and the positive contact is made through the contact of the bullseye contact pad 340 on the end of the motor 300 and the spring type contact 260 on the end connector 215.

FIG. 5B is a 3-D drawing of separate motor and motor mount according to an embodiment of the present invention, and FIG. 5C is a 3-D drawing of a combined motor and motor mount according to an embodiment of the present invention.

The present invention packages motors in a way that allows a competitive advantage to the user of the invention in that the user of the invention will have reduced component costs and assembly time, thus reducing the per cost of units using a motor or vibrator. The present invention allows motors to be a standardized component across multiple product lines, providing the user of the present invention with economies of scale. Mounting close to the circuit board in a low profile reduces size, simplified components allow for reduced manufacturing costs, and snap in without alignment allows for faster less complex manufacturing further reducing costs. Because of the prevalence of vibrator type electronic devices in use today, and the growing market for such devices, all improvements are essential to maximize competitiveness and market share.

Obviously, numerous modifications and variations of the present invention are possible in light of the above teachings. It is therefore to be understood that within the scope of the appended claims, the invention may be practiced otherwise than as specifically described herein.

What is claimed and desired to be secured by Letters Patent of the United States is:

1. A method of mounting a motor to an electrical device, comprising the steps of:
   mounting a low profile motor mount having a clip style motor attachment and electrical contacts without a required motor and electrical contact alignment to a portion of the electrical device;
   electrically connecting the electrical contacts to a power line and ground of the electrical device; and
   snapping an electrical motor into the clip style motor attachment;
   wherein:
   said motor mount comprises,
      a low profile base;
      a clip holder connected to said base;
      a contact having an electrical connection not electrically connected to said base;
   wherein:
   said clip holder is configured to hold a motor and make a first electrical connection with the motor, and said contact is configured to make a second electrical connection with said motor; and
   said contact is a battery style connector, comprising,
      two supporting feet, a first supporting foot connected to said base, and a second supporting foot also configured as an electrical contact,
      a battery contact pad and an electrical connection between the battery contact pad and the second supporting foot, and
      a dielectric insulating material forming a unit that secures at least part of the first supporting foot, at least a top portion of the second supporting foot, and at least part of the battery contact pad such that only a portion of the battery contact sloping toward a bottom part of said base is exposed for contact with the motor.

2. The method according to claim 1, wherein said contact comprises:
   two supporting feet, a first supporting foot connected to said base, and a second supporting foot also configured as an electrical contact;
   a battery contact pad and an electrical connection between the battery contact pad and the second supporting foot; and
   a dielectric insulating material forming a unit that secures at least part of the first supporting foot, at least a top portion of the second supporting foot, and at least part of the battery contact pad such that only a portion of the battery contact sloping toward a bottom part of said base is exposed for contact with the motor;
   wherein said second supporting foot, said battery contact pad, and the electrical connection between the battery contact pad and the second supporting foot comprises a single s-shaped bracket, a top portion of the s forming the battery contact pad, a bottom portion of said s forming said second supporting foot, and a middle portion of said s forming the electrical connection between the battery contact pad and the second supporting foot.

3. A motor mount, comprising:
   a low profile base;
   a clip holder connected to said base;
   a contact having an electrical connection not electrically connected to said base;
   wherein:
   said clip holder is configured to hold a motor and make a first electrical connection with the motor, and said contact is configured to make a second electrical connection with said motor;
   said contact is a battery style connector; and said contact comprises,
two supporting feet, a first supporting foot connected to said base, and a second supporting foot also configured as an electrical contact,
a battery contact pad and an electrical connection between the battery contact pad and the second supporting foot, and
a dielectric insulating material forming a unit that secures at least part of the first supporting foot, at least a top portion of the second supporting foot, and at least part of the battery contact pad such that only a portion of the battery contact sloping toward a bottom part of said base is exposed for contact with the motor.

4. The motor mount according to claim 3, wherein said clip is a cylindrical shape designed to fit exterior dimensions of a body of the motor.

5. The motor mount according to claim 3, wherein said contact is a spring connector.

6. The motor mount according to claim 3, wherein said clip has end flares along longitudinal end sides of the clip configured to facilitate widening of ends of said clip for insertion of the motor.

7. The motor mount according to claim 3, further comprising at least one solder contact point electrically connected to said base, and at least one solder contact point electrically connected to said contact.

8. The motor mount according to claim 3, wherein a length of said clip is equal or less than a length of a body or external casing of the motor.

9. The motor mount according to claim 3, wherein said motor is an axisymmetric vibrator.

10. The motor mount according to claim 3, wherein said second supporting foot, said battery contact pad, and the electrical connection between the battery contact pad and the second supporting foot comprises a single s-shaped bracket, a top portion of the s forming the battery contact pad, a bottom portion of said s forming said second supporting foot, and a middle portion of said s forming the electrical connection between the battery contact pad and the second supporting foot.

11. The motor mount according to claim 3, wherein said supporting feet are mounted on a Printed Circuit Board (PCB).

12. A motor mount, comprising:
a low profile base;
a clip holder connected to said base;
a contact having an electrical connection not electrically connected to said base; and
an end wall attached to a non-contact end of said base and configured to maintain the motor in an axial direction of said base and constructed as a semi-circular plate having a diameter of less than a height of a bottom surface of a main shaft of the motor;

wherein:
said clip holder is configured to hold a motor and make a first electrical connection with the motor, and said contact is configured to make a second electrical connection with said motor;
said low profile base, said clip, and said contact are an integrated structure;
said contact is a battery style connector;
said contact comprises,
two supporting feet, a first supporting foot connected to said base, and a second supporting foot also configured as an electrical contact,
a battery contact pad and an electrical connection between the battery contact pad and the second supporting foot, and
a dielectric insulating material forming a unit that secures at least part of the first supporting foot, at least a top portion of the second supporting foot, and at least part of the battery contact pad such that only a portion of the battery contact sloping toward a bottom part of said base is exposed for contact with the motor; and
said second supporting foot, said battery contact pad, and the electrical connection between the battery contact pad and the second supporting foot comprises a single s-shaped bracket, a top portion of the s forming the battery contact pad, a bottom portion of said s forming said second supporting foot, and a middle portion of said s forming the electrical connection between the battery contact pad and the second supporting foot.

13. The motor mount according to claim 12, wherein said clip is a cylindrical shape designed to fit exterior dimensions of a body of the motor.

14. The motor mount according to claim 13, wherein said clip has end flares along longitudinal end sides of the clip configured to facilitate widening of ends of said clip for insertion of the motor.

15. The motor mount according to claim 14, further comprising at least one solder contact point electrically connected to said base, and at least one solder contact point electrically connected to said contact.

16. The motor mount according to claim 15, wherein a length of said clip is equal or less than a length of a body or external casing of the motor.

17. The motor mount according to claim 16, wherein said motor is an axisymmetric vibrator.

18. The motor mount according to claim 12, wherein said supporting feet are mounted on a Printed Circuit Board (PCB).

* * * * *